United States Patent [19]
Koh et al.

[11] Patent Number: 5,427,976
[45] Date of Patent: Jun. 27, 1995

[54] METHOD OF PRODUCING A SEMICONDUCTOR ON INSULATING SUBSTRATE, AND A METHOD OF FORMING A TRANSISTOR THEREON

[75] Inventors: Risho Koh; Atsushi Ogura, both of Tokyo, Japan

[73] Assignee: NEC Corporation, Tokyo, Japan

[21] Appl. No.: 857,943

[22] Filed: Mar. 26, 1992

[30] Foreign Application Priority Data

Mar. 27, 1991 [JP] Japan .................. 3-085893

[51] Int. Cl.$^6$ ............................. H01L 21/20
[52] U.S. Cl. ..................... 437/89; 437/913; 437/915; 148/DIG. 26; 148/DIG. 164; 148/DIG. 53
[58] Field of Search ............... 437/89, 915; 148/DIG. 26, DIG. 164

[56] References Cited

U.S. PATENT DOCUMENTS

| | | | |
|---|---|---|---|
| 4,489,478 | 12/1984 | Sakurai | 437/915 |
| 4,637,127 | 1/1987 | Kurogi et al. | 437/89 |
| 4,651,407 | 3/1987 | Bencuya | 437/89 |
| 4,686,758 | 8/1987 | Liu et al. | 437/89 |
| 4,999,314 | 3/1991 | Pribat et al. | 437/89 |
| 5,122,476 | 6/1992 | Fazan | 437/915 |
| 5,135,888 | 8/1992 | Chan et al. | 437/915 |
| 5,192,705 | 3/1993 | Itoh | 437/89 |
| 5,198,694 | 3/1993 | Kwasnick et al. | 257/766 |
| 5,212,104 | 5/1993 | Klose | 437/89 |

OTHER PUBLICATIONS

"Structure Design for Submicron MOSFET on Ultra Thin SOI", Y. Yamaguchi, et al., 1990 IEEE IEDM Technical Digest, pp. 591-594.
"Calculated Threshold-Voltage Characteristics of an XMOS Transistor Having an Additional Bottom Gate", T. Sekigawa, et al., Solid-State Electronics, vol. 27, Nos. 8/9, pp. 827-828, 1984.
"Limitations on MOS ULSIs", M. Fukuma, 1988 Symposium on VLSI Tech., pp. 7-8.
"A New Structural Approach for Reducing Hot Carrier Generation in Deep Submicron MOSFETs", Al F. Tasch, et al., 1990 Symposium on VLSI Technology, pp. 43-44.
"Analysis of the Drain Breakdown Mechanism in Ultra-Thin-Film SOI MOSFET's", M. Yoshimi, et al., IEEE Transactions on Electron Devices, vol. 37, No. 9, Sep. 1990, pp. 2015-2021.
J. L. Glenn Jr., et al. "An Inverted and Stacked PMOS Transistor by Silicon Epitaxial Lateral Overgrowth," Solid-State Electronics vol. 33, No. 7, pp. 881-884 (1990).

*Primary Examiner*—Robert Kunemund
*Assistant Examiner*—Linda J. Fleck
*Attorney, Agent, or Firm*—Burns, Doane, Swecker & Mathis

[57] ABSTRACT

In a field intensity relaxation of the drain end of a MOSFET, a projective area is not increased with a reduced electrostatic coupling of the source or drain with the gate. The MOSFET satisfying such condition is fabricated on the SOIS film formed by processes of the lateral vapor phase epitaxial growth and the like. A U-shape low concentration impurity region is provided on a gate electrode through a gate dioxide film and high concentration impurity regions are formed at the tops of protrusions. The gate electrode is embedded in insulation films, and the transistor region is fabricated by the lateral vapor phase epitaxial growth and the like.

8 Claims, 16 Drawing Sheets

$V_D = 0.1V, V_g = V_{th} (-0.277V)$

METHOD OF PRODUCING A SEMICONDUCTOR ON INSULATING SUBSTRATE, AND A METHOD OF FORMING A TRANSISTOR THEREON

BACKGROUND OF THE INVENTION

The present invention relates to a semiconductor device for memories, logic circuits and the like which require a high integrability and a method of producing the same.

A report of analysis about a gate overlapped drain (LDD) structure as shown in FIG. 1 for improving a characteristic of an SOISMOSFET by Yamaguchi et al is disclosed in the "1990 IEDM Technical Digest".

In FIG. 1, the reference numeral 101 depicts a silicon substrate, 102 a silicon dioxide film, 103 a low impurity concentration p-type region, 104 a low impurity concentration n-type region, 105 a high impurity concentration n-type region, 106 a gate dioxide film and 107 a gate electrode.

As a structure of the SOISMOSFET for suppressing a drain voltage induced barrier height reduction effect, a structure of an XMOS transistor with a top gate and a bottom gate as shown in FIG. 2 is reported by T. Sekigawa et al in the "Solid State Electronics", of 1984, Vol. 27, p.827 and further a structure of the SOISMOSFET with a potential fixed back gate as shown in FIG. 3 is reported by M. Fukuma in the "1988 Symposium on VLSI Technology Digest of Technical Papers" p.7.

In FIG. 2, the numeral 108 depicts a silicon substrate, 109 a silicon dioxide film, 110 a silicon dioxide film, 111 an upper gate electrode, 112 a lower gate electrode, 113 a channel region, 114 a source and 115 a drain as well as 116 a gate oxide film. The number 16 indicates a gate oxide film.

In FIG. 3, 117 depicts a high impurity concentration p-type silicon substrate, 118 and 122 silicon dioxide films, and, 121 a high impurity concentration n-type regions, 120 a neutral silicon region and 123 a gate electrode. The number 122 indicates an insulating film for insulating the gate electrode 123.

Still further, a method of exercising an electric field relaxation of the MOSFET produced on the bulk wafer at the source and drain regions in the vertical structure as shown in FIG. 4 was proposed by A.L.F. Tasch. et al and is disclosed in the "1990 Symposium on VLSI Technology Digest of Technical Papers", p.43.

In FIG. 4, the numeral 124 depicts a silicon substrate, 125 a high impurity concentration n-type region, 126 a low impurity concentration n-type region, 127 a second high impurity concentration n-type region, 128 a silicon dioxide film and 129 a gate electrode.

There are two problems in realization of the short channel of the SOISMOSFET. The first one is a floating substrate effect which is likely caused by an impact ionization with an increase of a lateral electric field intensity at the drain end as reported by Yoshimi et al in the "IEEE Transaction of Electron Devices" ED37 No. 9, in 1990, p. 2015.

The second one is a short channel effect with a punchthrough which are caused by the barrier height reduction owing, to an electric field from the drain.

To solve the foregoing problems, the conventional measure as shown in FIG. 1 provides low impurity concentration regions at the source and the drain regions entailing, however, an increase of a region of the transistor in proportion to the low impurity concentration area to prevent a high integration.

While, in the conventional bulk MOSFET as shown in FIG. 2, the vertical deposit structure brings a field relaxation to suppress an increase of an area of the low impurity concentration region but there occurs the problems of parasitic capacities of gate side wall to source and/or drain as well as an electric field concentration at the corner under the gate electrode.

The conventional MOSFETs as shown in FIGS. 3 and 4 are considered as suitable structures to overcome the second problem, while a combination with another measure is required to overcome the first problem.

SUMMARY OF THE INVENTION

Objects of the present invention are to provide a method of producing an SOIS, a structure of a transistor and a method of producing the transistor.

In a structure of a SOISMOSFET of the invention, a semiconductor thin film is provided on an insulator, two regions embracing a channel region are protruded upwardly, a high concentration layer of the second conductive type impurity is provided at the tops of the protrusions, the semiconductor at its region other than the high impurity concentration layer is doped with a first conductive type impurity of the low concentration and/or a second conductive type impurity of the low concentration or no doping of the impurity takes place and further a control electrode is arranged under the channel region through an insulator.

A production process of an SOIS (semiconductor on insulating substrate) with use of the lateral vapor phase epitaxial growth is comprised of the steps of depositing the second material on an insulator formed on a semiconductor substrate, patterning the second material with etching to have protrusions and a depression vertical to the insulating substrate surface and for obtaining a longitudinally and uniformly extended section so as to contact a region of a part of a spacer with a semiconductor monocrystal to form a seed area, coating the spacer with a cover made of the insulation film or a third material, providing an opening apart from the seed area on a part of a cover, removing the second material from the opening by the selective etching of the second material to form a slit and growing selectively and epitaxially the semiconductor monocrystal in the slit with use of the semiconductor monocrystal as a seed whereby to produce the monocrystalline semiconductor with uniform section extended to the predetermined length.

In a production process of an SOIS including a process of forming the spacer, protrusions and a depression are formed by etching the insulator formed on the semiconductor substrate or by arranging a dummy pattern on the insulator formed on the semiconductor substrate and a material for the spacer is deposited.

In a process of forming a spacer, the first spacer is deposited on the insulator formed on the semiconductor substrate, a dummy pattern is formed on the first spacer, the second spacer is deposited on the entire surface, the entire second spacer on the dummy pattern and the second spacer or both of the first spacer and second spacer at the flat portion where the dummy pattern is not present are removed by the etch backs, or the dummy pattern and the spacers are subjected to a forming and a processing for a plurality of times.

A production process of an SOISMOSFET is comprised of the steps of forming a control electrode on the insulation substrate, forming an SOIS film having upward protrusions embracing the channel region by the methods as claimed for positioning at least a part of the channel region on the control electrode after an insulating film is provided on the control electrode surface and forming the high concentration impurity layer by the ion-implantation and diffusion or by the vapor phase epitaxial growth so as to dope the impurity to the portion other than the high concentration impurity layer by the ion-implantation and the diffusion, or doping in the SOIS growth or not doping impurity to the portion other than the high concentration layer.

In a production process of an SOISMOSFET, a measure of forming the SOIS film having the upward protrusions embracing the channel region is comprised of the steps of forming a control electrode on the insulation substrate, forming the SOIS film by an epitaxial lateral overgrowth (ELO) procedure, a tunnel epitaxial procedure or a lateral solid phase epitaxy (LSPE) procedure on the control electrode or on and around the control electrode after the insulation film is disposed on the control electrode surface and converting at least a part of the region on the control electrode into a thinner film by etching.

In a production process of an SOISMOSFET, a measure of forming the SOIS film having the upward protrusions embracing the channel region is comprised of the steps of forming a control electrode on the insulation substrate, forming the SOIS film by an epitaxial lateral overgrowth (ELO) procedure, a tunnel epitaxial procedure and a lateral solid phase epitaxy (LSPE) procedure on the control electrode or on and around the control electrode after the insulation film is disposed on the control electrode surface, providing subsequently or after the SOIS film is converted into the thin film by etching an insulation film having an opening on the region with the protrusion and growing a semiconductor on the opening by the selective vapor phase epitaxial growth.

A method of producing an SOIS film having protrusions and a depression on the surface thereof is comprised of the steps of forming a dummy pattern on the flat SOIS film, depositing an amorphous semiconductor on the entire surface of the dummy pattern, removing the entire second spacer on the dummy pattern and/or the second spacer or both of the second spacer and the SOIS film by an anisotropic etching, heating subsequently or after the entire surface thereof is coated with an insulation film and the like or after the dummy pattern is removed and converting at least a lower amorphous semiconductor into a monocrystal by the solid phase epitaxial growth with use of the SOIS film as a seed.

In a method of producing an SOISMOSFET, as a measure of forming the SOIS film having the upward protrusions embracing the channel region, the protrusions may be formed by the claimed method after the SOIS film is formed, or after the SOIS film is formed and converted into the thinner film.

The claimed transistor effects a field relaxation at the vertical section to suppress an impact ionization and a voltage induced barrier height reduction. Since the electrostatic coupling caused between the electrodes is weakened, freedom of the interconnection arrangement coming from the electrodes is increased by separating the source and drain electrodes upwardly and the gate electrode downwardly.

The production process of the SOIS as claimed is to process the spacer material into the required shape and to epitaxially grow it in the slit formed by the etching. The spacer shape is profiled by the etching. The spacer shape is profiled by depositing the spacer material on the pattern. The film thickness of the SOIS may be varied depending on the position by depositing the spacer material for a plurality of times. In the production process of the SOIS, the vertical section is formed with use of the solid growth.

The transistor is produced by growing the SOIS film with use of the claimed methods. After the SOIS film is formed on the gate electrode, the transistor is produced by the etching process. The claimed transistors are formed by the selective vapor phase epitaxial growth for the vertical section and by the solid phase epitaxial growth.

BRIEF DESCRIPTION OF THE DRAWINGS

FIG. 26 is a potential distribution diagram obtained by the simulation when $V_D=3.0$ V and $V_g=V_{th}$ for the transistor of

PREFERRED EMBODIMENTS OF THE INVENTION

Figure 5:
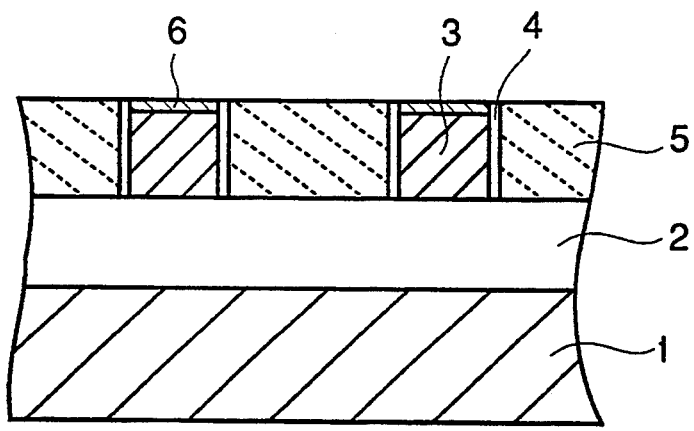
FIGS. 5 to 9 are fragmentarily sectioned views of an SOIS device for the first embodiment of the production process according to the invention.

In FIG. 5, a silicon substrate 1 is subjected to a thermal oxidization for 0.5 micrometer to form a first dioxide film 2, a polysilicon 3 is deposited for 0.5 micrometer by a low pressure CVD (chemical vapor deposition) and after diffusion of the high concentration boron into a polysilicon 3, which is in turn processed to have 0.2 micrometer width and 5 micrometer length by a photolithography or a RIE (relative ion etching) and vertically and longitudinally arranged at an interval of 0.6 micrometer. The polysilicon 3 may serve as a control gate electrode of a transistor. Oxygen is supplied under the thermal oxidization onto the polysilicon surface to form a silicon dioxide film with thickness of 0.02 micrometer or the second silicon dioxide film 4 and the third silicon dioxide film 5 are deposited for 0.5 micrometer by the low pressure CVD and then coated with a spin-on-glass at 0.2 micrometer for flattening before the spin-on-glass and the dioxide film are etched respectively for 0.2 micrometer and 0.52 micrometer by the RIE, and $O_2$ is introduced on an exposed surface of polysilicon under the thermal oxidization to form a silicon dioxide with thickness of 0.015 micrometer or a fourth silicon dioxide film 6.

Figure 6:
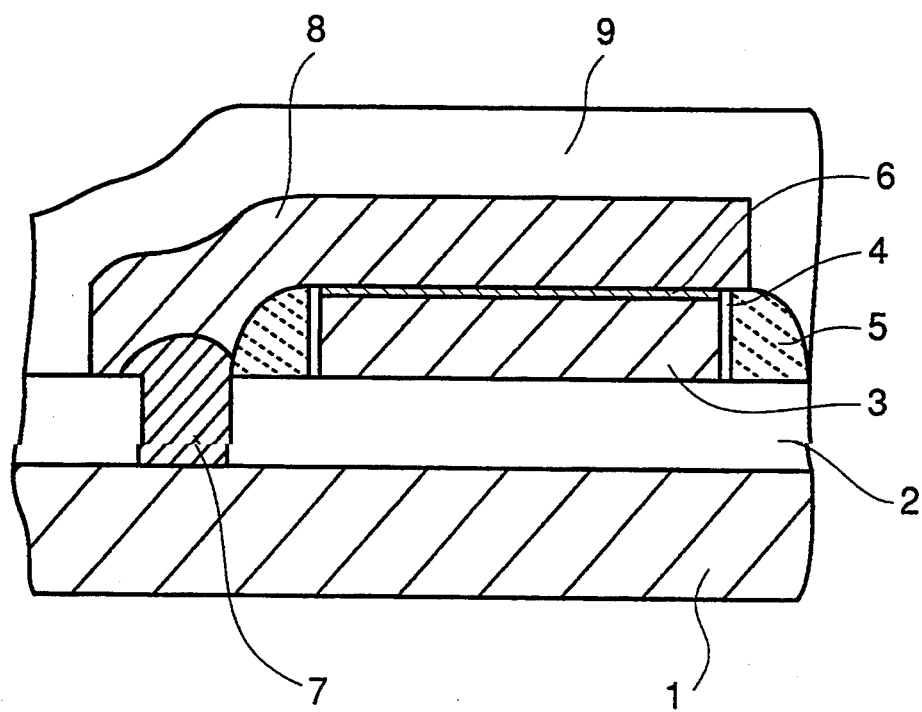
Figure 7:
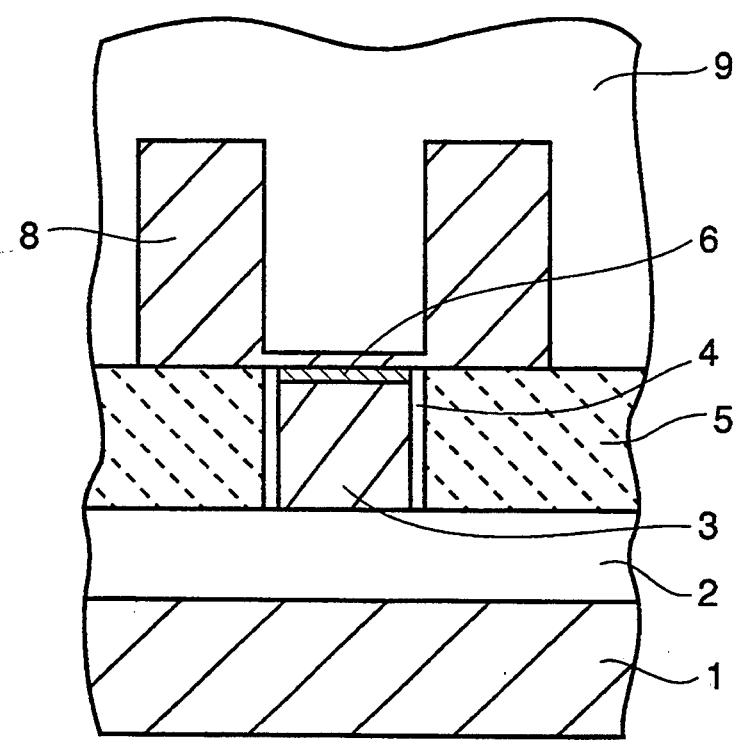

As shown in FIGS. 6 and 7, the first dioxide film 2 is provided therein with an opening of 0.2 micrometer square by the photolithography or RIE at an interval of 2 micrometer to the position from the drawing of the pattern of the polysilicon 3 and the opening reaches the silicon substrate 1. A monocrystalline silicon 7 with the same orientation as the silicon semiconductor substrate is thus grown and filled in the opening by the selective vapor phase epitaxial growth with both thermal decomposition and hydrogen reducing reaction of, for example, tetrachlorodisilane and/or dihydrodichlorosilane. Thereafter, the second polysilicon 8 is deposited for 0.27 micrometer on the entire surface formed by the low pressure CVD and then subjected to a patterning by the photolithography or RIE. The second polysilicon 8 is then overlapped with the space of 0.2 micrometer to the pattern of the polysilicon 3 at the upper polysilicon 3, and the pattern of the second polysilicon 8 is separated toward the position from the drawing of FIG. 6, corresponding to the pattern of the polysilicon 3, in the form to reach the upper monocrystalline 7. The second polysilicon 8 which is partially overlapped with the polysilicon 3 is again etched for 0.25 micrometers (0.02 micrometers is remained) by the photolithography or RIE. Thus, a fifth silicon dioxide film 9 is deposited for 0.5 micrometer on the entire surface formed.

Figure 8:
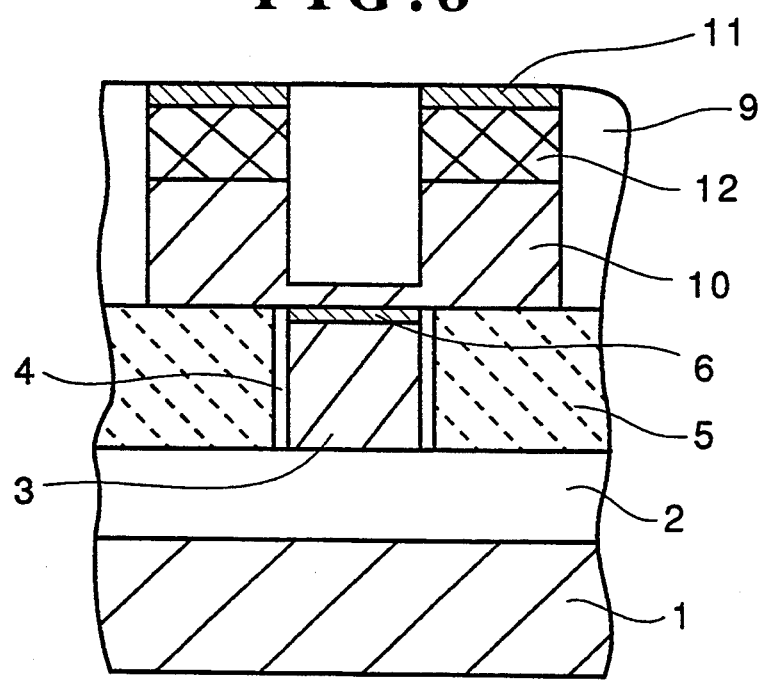
Figure 7A:
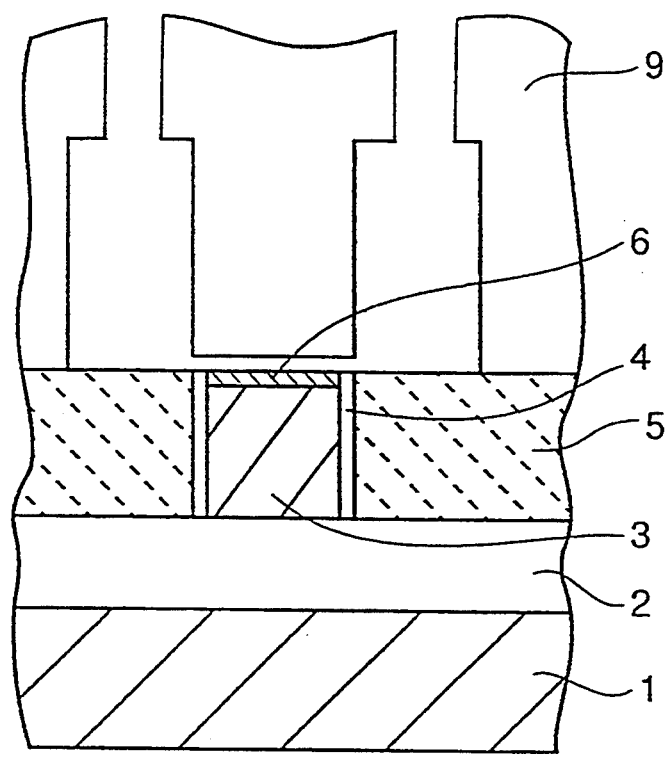

As shown in FIG. 7A, the fifth silicon dioxide film 9 is partially removed, for example in the shape of 0.3 micrometers square, by etchings such as the photolithography or RIE at a portion without any contact to the monocrystalline silicon 7 of the polysilicon 3. A polysilicon is removed from the opening by the selective chemical etching, for example, using chlorine gas to form a slit. As shown in FIG. 8 (which is a sectional view of the device of FIG. 7 in which the sectional view does not include the semiconductor monosilicon 7) in the slit a monocrystalline silicon 10 is formed with use of the monocrystalline silicon 7 as a seed at the position where the polysilicon 8 was formerly placed, through the selective vapor phase epitaxial growth with both the thermal decomposition and hydrogen reducing reaction of, for example, the tetrachlorodisilane and/or dihydrodichlorosilane. The fifth silicon dioxide film 9 is etched for 0.5 micrometer by the RIE to expose the protrusion surface of the monocrystallin silicon 10. The surface of the monocrystalline silicon 10 is thermally oxidized for 0.02 micrometer to form a sixth silicon dioxide film 11 and then by the ion-implantations of P+ $5 \times 10^{12}$ cm$^{-2}$ at 180 keV and As+ $5 \times 10^{15}$ cm$^{-2}$ at 70 keV and further by diffusion through annealing in the nitrogen gas for ten minutes at 900° C., a high concentration n-type impurity layer 12 is provided on the upper protrusion end of the monocrystalline silicon 10 to convert the other portion than the monocrystalline silicon 10 into the low concentration n-type.

Figure 9:
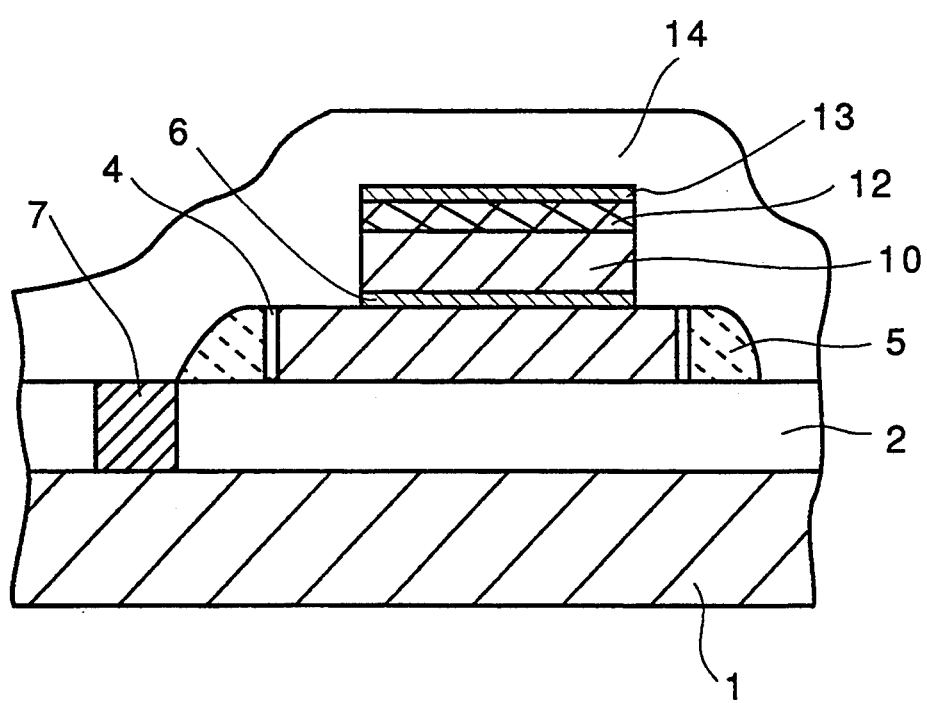

In FIG. 9, the fifth dioxide film 9 remaining in the depression is removed by the RIE to expose the monocrystalline silicon 10, thereafter the monocrystalline silicon 10 at its front and rear ends from the drawing of the monocrystalline silicon 10 is arranged by the photolithography or RIE for protruding the polysilicon 3 of the gate electrode from the monocrystalline silicon 10 to both the front and rear ends thereof respectively for 1 micro meter. The surface of the monocrystalline silicon 10 is thermally oxidized to form a seventh silicon dioxide film 13 for 0.02 micrometers, thus an eighth silicon dioxide film 14 is deposited on the entire surface formed by the low pressure CVD.

The high concentration impurity layer 12 serves as the source and drain and the polysilicon 3 as the gate. The interconnection for the source and the drain is carried out by providing an opening in the eighth dioxide film 14 on the high concentration impurity layer 12, and the interconnection for the gate is obtained by providing the opening in the eighth dioxide film 14 on the left or right ends of the polysilicon 3 to reach the tops of the protrusion (FIG. 9).

Figure 10:
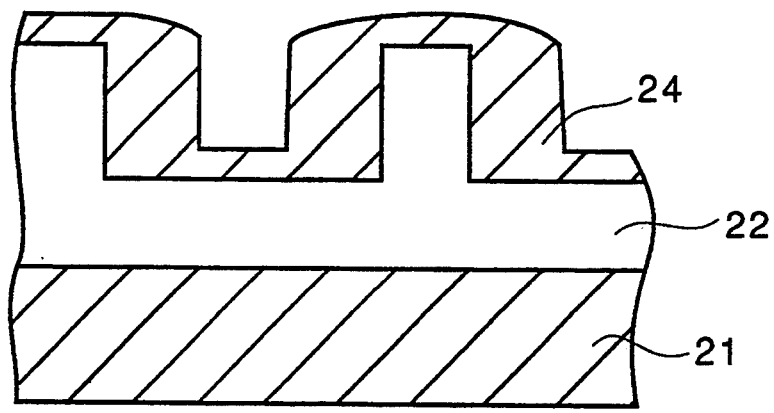
FIGS. 10 to 12 are fragmentarily sectioned views of an SOIS device for the second embodiment of the production process according to the invention.
Figure 11:
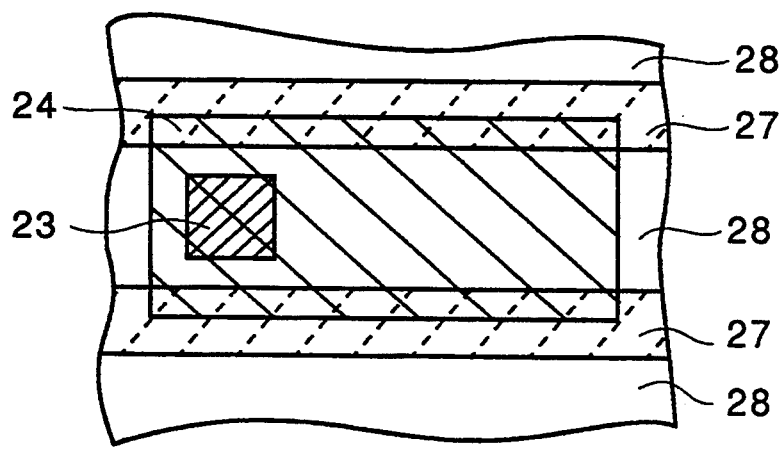

In FIGS. 10 and 11, a silicon substrate 21 is thermally oxidized for 1.0 micrometer to form the first silicon dioxide film 22, which is etched for 0.6 micrometer width and 0.27 micrometer depth at the interval of 0.2 micrometer. The depression of the first silicon dioxide film 22 is provided therein with an opening reaching to the silicon substrate for 0.6 micrometer square and a monocrystalline silicon 23 is grown at the opening by means of the selective vapor phase epitaxial growth with both the thermal decomposition and hydrogen reducing reaction of the tetrachlorodisilane and/or dihydrodichlorosilane. A polysilicon 24 is deposited on the entire surface formed for 0.2 micrometer by the low pressure CVD to process the flat portion thereof into a thinner film by an anisotropic etch back of 0.18 micrometer for the polysilicon 24.

Figure 12:
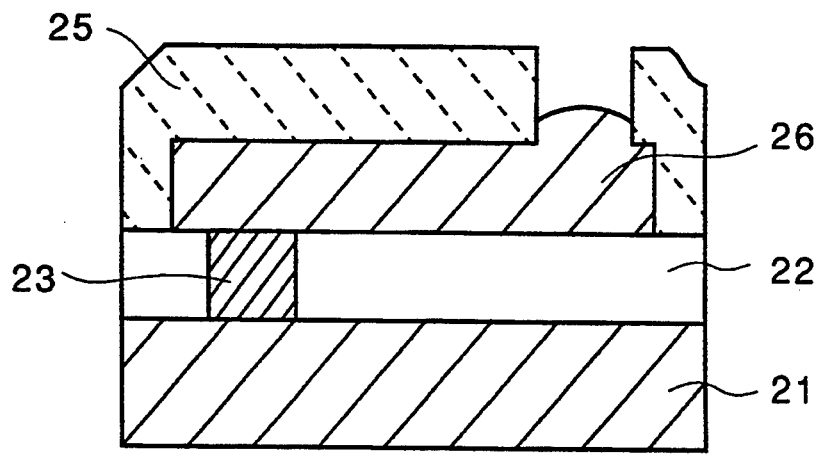

To obtain a region where the monocrystalline silicon 23 is superimposed with the polysilicon 24 at its one end as shown in FIG. 11, the polysilicon 24 is patterned, for example, for a 5 micrometer length by the photolithography or RIE to deposit the second silicon dioxide film 25 on the entire surface formed by the low pressure CVD, thereafter at the end of the polysilicon 24 where the monocrystalline silicon 23 is not present, the second silicon dioxide film 25 is provided with an opening from which the polysilicon 24 is selectively and chemically etched, for example, by chlorine gas to form a slit in which the second monocrystalline silicon 26 is formed with use of the monocrystalline silicon 23 as a seed by the selective vapor phase epitaxial growth with both the thermal decomposition and hydrogen reducing reaction of the tetrachlorodisilane and/or dihydrodichlorosilane as shown in FIG. 12. In FIG. 11, numerals 27 and 28 depict protrusions and a depression of the first dioxide film 22, respectively.

Figure 13:
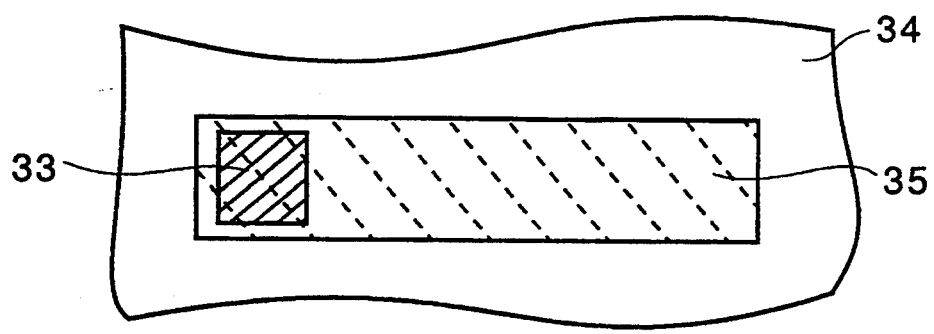
FIGS. 13 and 14 are fragmentarily sectioned views of an SOIS device for the third embodiment of the production process according to the invention.
Figure 14:
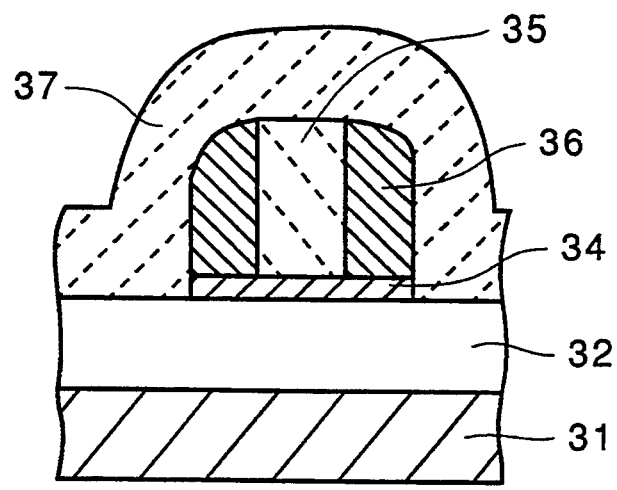

In FIGS. 13 and 14, a silicon substrate 31 is thermally oxidized for 0.5 micrometer to form the first dioxide film 32, and an opening of 0.6 micrometer square is provided by the photolithography and RIE in which a monocrystalline silicon 33 is formed by the selective vapor phase epitaxial growth with both the thermal decomposition and hydrogen reducing reaction of the tetrachlorodisilane and/or dihydrodichlorosilane. The first polysilicon 34 of thickness 0.02 micrometer and the second dioxide film 35 of thickness 0.3 micrometer are sequentially deposited on the resultant entire surface by the low pressure CVD to pattern in the rectangular shape by the photolithography or RIE so as to superimpose the end of the second dioxide film 35 on the monocrystalline silicon 33.

The second polysilicon 36 is deposited on the entire surface formed for 0.2 micrometer, and subsequently the anisotropic etch back is carried out by the RIE for 0.22 micrometer against the second polysilicon 35 and the first polysilicon 34 to remove the first polysilicon 34 and the second polysilicon 36 but without removing the periphery of the pattern of the second dioxide film 35, thus the third dioxide film 37 is deposited by the low pressure CVD for 0.5 micrometer.

At the end of the first polysilicon 34 which has no contact with the monocrystalline silicon 33, the second silicon dioxide film 35 and the third silicon dioxide film 37 are provided with openings from which the first polysilicon 34 and the second polysilicon 36 are selectively etched, for example, by chlorine gas to form a slit in which a monocrystalline silicon is formed with use of the monocrystalline silicon 33 as a seed by the selective vapor phase epitaxial growth with both the thermal decomposition and hydrogen reducing reaction of the tetrachlorodisilane and/or dihydrodichlorosilane.

Figure 15:
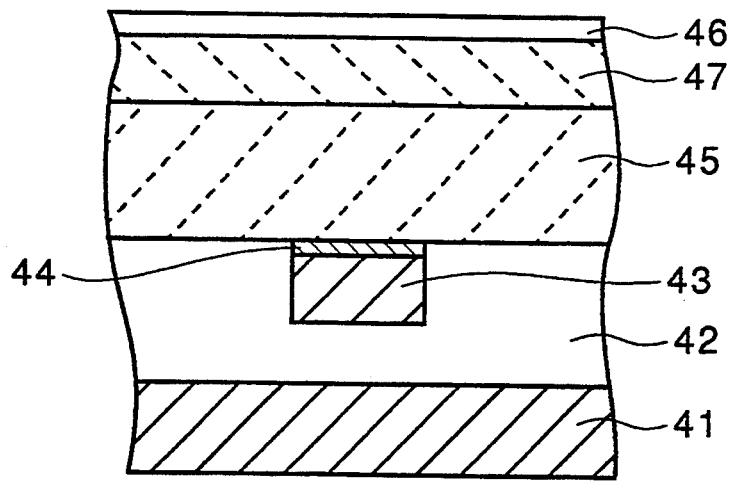
FIGS. 15 and 16 are fragmentarily sectioned views of an SOIS device for the fourth embodiment of the production process according to the invention.

In FIG. 15, a first dioxide film 42 of thickness of 1 micrometer is formed on a silicon substrate 41 by the thermal oxidation and an etched portion thereof is embedded with a p-type polysilicon 43 which serves as a gate electrode and on the polysilicon 43 a second dioxide film 44 is placed and further a monocrystalline silicon 45 of 0.27 micrometer thickness is provided on the second dioxide film 44. This process may be carried out, for example, by the same process as that of the first embodiment but free of the etching process for the second polysilicon 8 which is superimposed with the polysilicon 3. The surface of the monocrystalline silicon 45 is thermally oxidized to form a third silicon dioxide film 46 of 0.01 micrometer thickness, thereafter by the ion-implantations of As+ $5 \times 10^{15}$ cm$^{-2}$ at 70 keV and P+ $5 \times 10^{12}$ cm$^{-2}$ at 180 keV and further by diffusion through annealing in nitrogen gas for ten minutes at 900° C., the monocrystalline silicon 45 is converted into a low concentration n-type and concurrently an n-type high concentration impurity layer 47 is formed on the surface thereof.

Figure 16:
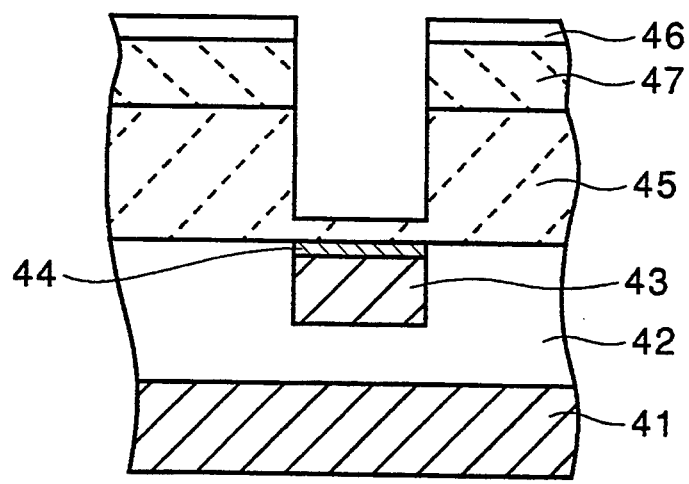

By means of the photolithograph or RIE, a structure as shown in FIG. 16 is formed by the etching of 0.25 micrometer through both of the third silicon dioxide film 46 and the n-type high concentration impurity layer monocrystalline silicon 45 but so as to remain by 0.01 micrometer thickness of the monocrystalline silicon in which the monocrystalline silicon region above the p-type polysilicon 43 is subjected to etching.

Figure 17:
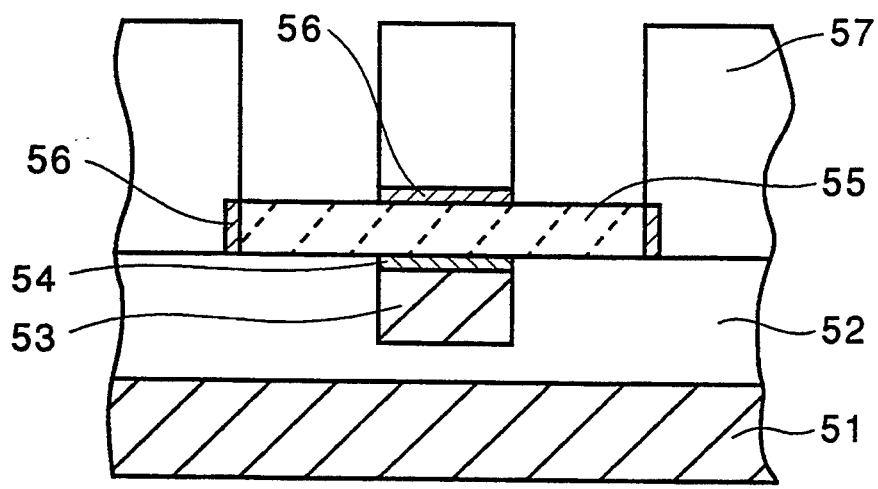
FIGS. 17 to 20 are fragmentarily sectioned views of an SOIS device for the fifth embodiment of the production process according to the invention.

In FIG. 17, a first dioxide film 52 of thickness of 1 micrometer is provided on a silicon substrate 51 and an etched portion thereof is embedded with a p-type polysilicon 53 which serves as a gate electrode and on the polysilicon 53 a second dioxide film 54 is placed and further a monocrystalline silicon 55 of 0.015 micrometer thickness is provided on the second dioxide film 54. This process may be carried out, for example, by the same process as in the first embodiment but employing a constant film thickness of 0.015 micrometer of the polysilicon as the spacer or forming a thinner film by etching with the thermally oxidation after the SOIS film of a constant thickness is formed.

Two protrusions are pattern formed by the photolithography or RIE from opposite ends of the silicon monocrystalline SOIS film 55 on the gate electrode and the pattern of the gate electrode. The silicon monocrystalline SOIS film 55 is thermally oxidized for 0.01 micrometer while supplying O$_2$ thereby to form a third dioxide film 56 and a fourth dioxide film 57 of 0.3 micrometer is deposited by the low pressure CVD.

Figure 18:
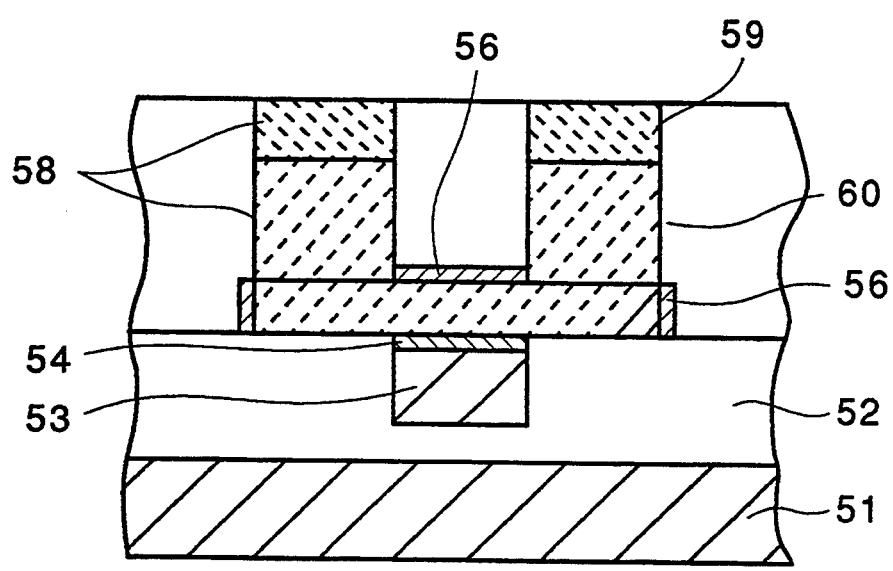

In FIG. 18, by the photolithography and RIE the protrusions are provided with openings in which a monocrystalline silicon 58 is formed by the selective vapor phase epitaxial growth. The structure of FIG. 18 is obtained by the ion-implantation of As+ $5 \times 10^{15}$ cm$^{-2}$ at 70 keV and P+ $5 \times 10^{12}$ cm$^{-2}$ at 180 keV and further by diffusion through annealing in nitrogen gas at 900° C. for ten minutes. Numerals 59 and 60 in FIG. 18 are an n-type high concentration layer and an n-type low concentration layer, respectively.

As another method of forming an opening for growing the silicon monocrystalline 58, the silicon monocrystalline SOIS film 55 is patterned to form the third dioxide film 56 on the surface thereof before a dummy pattern 61 of thickness of 0.3 micrometer is provided so as to be superimposed on the polysilicon 53 by the low pressure CVD, photolithography or RIE and the polysilicon 62 of the spacer is deposited for 0.2 micrometer by the low pressure CVD or with the etch back for 0.21 micrometer concurrently with the etching of the silicon monocrystalline SOIS film 55 thereby to form the polysilicon 62 at the side wall of the dummy pattern 61.

Figure 19:
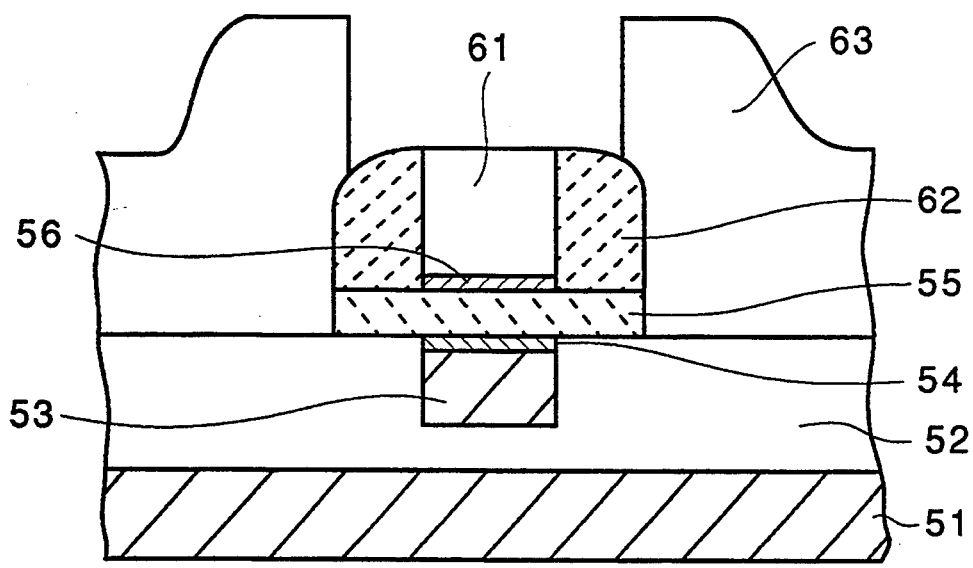

Further, after the fourth dioxide film 63 is deposited for 0.5 micrometer by the low pressure CVD, the fourth dioxide film 63 is provided with an opening through which the polysilicon 62 may preferably be etched as shown in FIG. 19.

Figure 20:
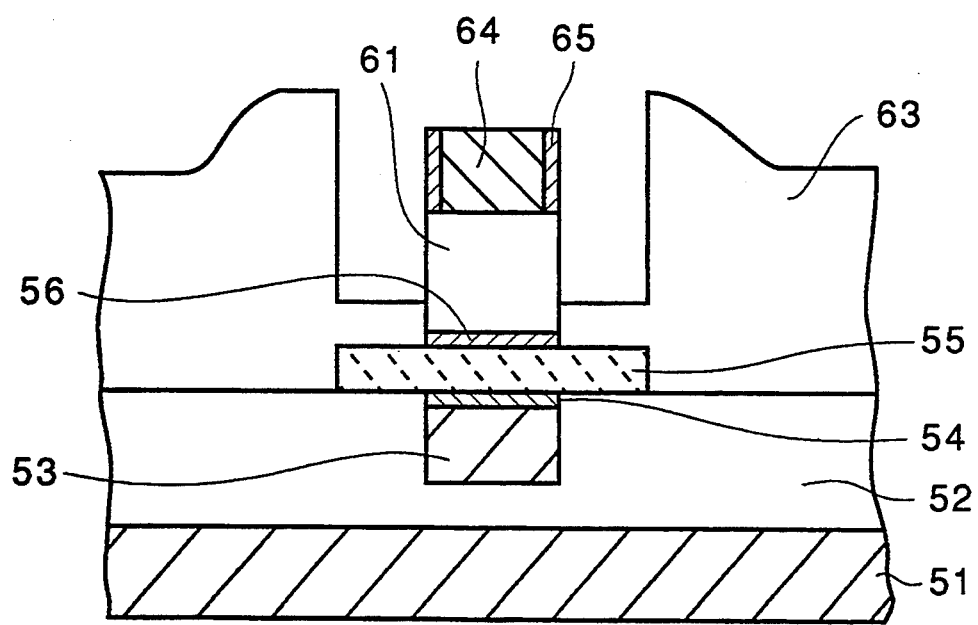

Similarly, as a further method of forming an opening for growing the silicon monocrystalline 58, a pattern 64 of lower etching speed material as compared with the dioxide film such as the polysilicon is formed in the inside or on the surface of the fourth dioxide film 63 and above the gate polysilicon 53 and thereafter the region including the pattern 64 is etched by the photolithography or RIE and at a suitable timing the pattern 64 may also be etched, or after a resist is removed a side surface of the pattern 64 is oxidized to form a fifth dioxide film 65 and then the anisotropic dioxide film may preferably be etched as shown in FIG. 20.

Figure 21:
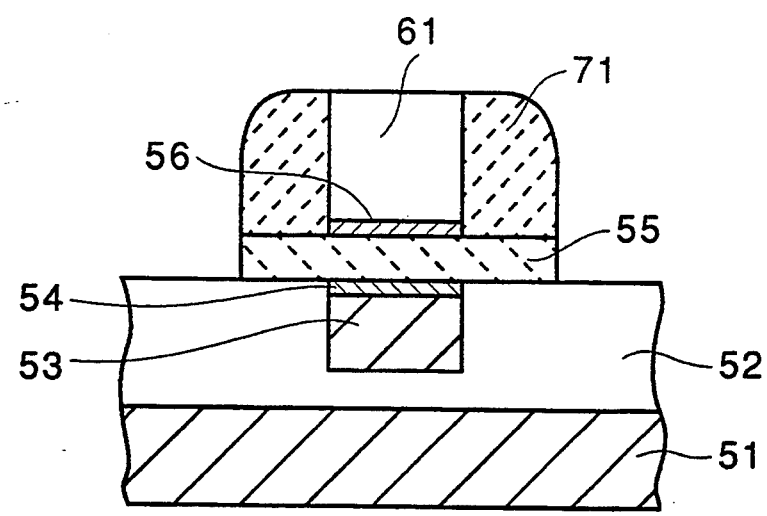
FIGS. 21 and 22 are fragmentarily sectioned views of an SOIS device for the sixth embodiment of the production process according to the invention.
Figure 22:
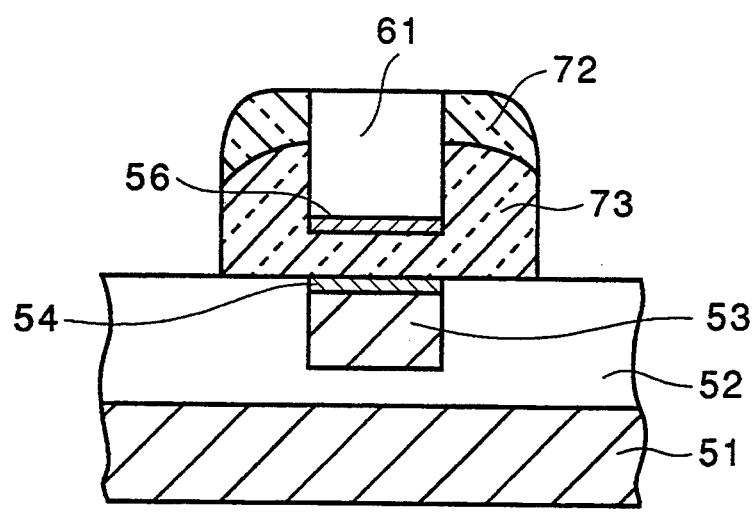

In FIG. 21, an amorphous silicon 71, for example, of thickness of 0.2 micrometer is deposited by the etch back, in place of the embodiment of FIG. 20 where the spacer on the side wall of the dummy pattern 61 is formed with the amorphous silicon 71. The amorphous silicon 71 can be replaced by a polysilicon. In a nitrogen gas atmosphere or after the dioxide film is deposited by sputtering, CVD and the like, the deposited amorphous silicon 71 is heated and further deposited, for example, at 600° C. for five hours to be a monocrystal silicon by applying the silicon monocrystalline SOIS film 55 to a monocrystalline seed therefor. The structure as shown in FIG. 22 is thus obtained by the ion-implantation of As$^{30}$ $5 \times 10^{15}$ cm$^{-2}$ at 70 keV and P+ $5 \times 10^{12}$ cm$^{-2}$ at 180 keV and further by annealing in nitrogen gas at 900° C. for ten minutes. Numerals 72 and 73 depict a high concentration impurity polysilicon layer and a low concentration impurity polysilicon layer, respectively.

In the embodiments as hereinbefore described, the silicon dioxide films are employed as insulation films, but there may preferably be employed another insulation film such as a silicon nitride film, a metal dioxide film, a silicon carbide film, a diamond film or a composite film.

The process of forming the silicon dioxide film by oxidization of the silicon has been described in the embodiments, but another method for forming the film such as CVD, sputtering, vacuum evaporation, MBE (molecular beam epitaxy) or the like may also be available. In the first embodiment, when the method of producing SOIS of the second embodiment is employed, the gate dioxide film may be formed by the thermal oxidation after the dummy pattern is etched.

The silicon is selected for the semiconductor in the embodiments, but the other semiconductor like gallium arsenide or aluminum gallium arsenide may be available.

The low pressure CVD, sputtering, vacuum evaporation, MBE and the like may also be employed as a method of forming the film.

The patterning is carried out by the photolithography or RIE in the embodiments, but an electron beam exposure, an X ray exposure, a wet etching or a self-align process may also be available.

The invention is not limited to the examples of the film thickness as shown in the embodiments. However, the insulation film requires a thickness enough to secure a dielectric breakdown strength against the working voltage after the transistors are formed.

The monocrystalline seeds are grown by the selective growth of semiconductor through the square shape opening of the dioxide film in the embodiment, but any method of contacting the spacer with the monocrystalline semiconductor may be available. The linear shape opening may also be employed even when the opening is formed or the selective epitaxial growth procedure is carried out as is the case of the first embodiment.

The sizes of the transistor, gate electrode and spacer, and the distance between the seed and the spacer are not limited to the examples of the embodiments. For the material of the gate electrode, a conductor such as tungsten and the like may be available.

The polysilicon is employed as a spacer in the embodiment, but the other materials for which the selective etching could be carried out on the substrate and the cover may be employed.

In the embodiment, the dummy pattern is formed by the deposit and etching of the dioxide film, but another method such as the selective oxidation process may be available. For the dummy pattern, there may be employed other materials which never impede the selective vapor phase epitaxial growth of semiconductor, such as silicon and metal coated with the nitride film or the insulation film. The n-channel transistor in the embodiment may be replaced by the p-channel transistor.

While As+ and P+ have been described as an impurity in the embodiment, other impurities may be employed according to the semiconductor and the channel type to be used.

The high concentration impurity layer is formed by ion-implantation in the embodiment, but the high concentration impurity layer may be formed by vapor phase epitaxial growth with doping and further it may also be formed by adding a semiconductor such as polysilicon, amorphous silicon containing the high concentration impurity or formed with use of the diffusion from the vapor phase, liquid phase and solid phase.

In the embodiment, the example employing the second conductive type impurity layer has not been proposed.

For example, however, the impurity layer may be introduced into the horizontal portion confronting the gate or the bottom of SOIS, while the impurity layer should preferably not be introduced to the other portion than the high concentration impurity layer. Further, the second conductive type impurity layer and the low concentration impurity layer may be formed with use of the ion-implantation, doping during the growth or any diffusion from the vapor phase, the liquid phase of the solid phase.

While the gate electrode corresponds only to the center of the transistor in the embodiment, the gate electrode should not be so limited, but it may correspond, for example, to the entire region of the SOIS bottom. Although the polysilicon semiconductor layer embedded with the gate electrode is flattened in the embodiment, a not-flattened shape type, for example, a projected gate electrode may be employed.

In the first, second and third embodiments, the U-shape section has been described, nevertheless such U-shape is not always required and a shape protruding upwardly may also be available. In the sixth embodiment, the U-shape section is not required and a longitudinally and uniformly extended shape may be available.

Figure 23:
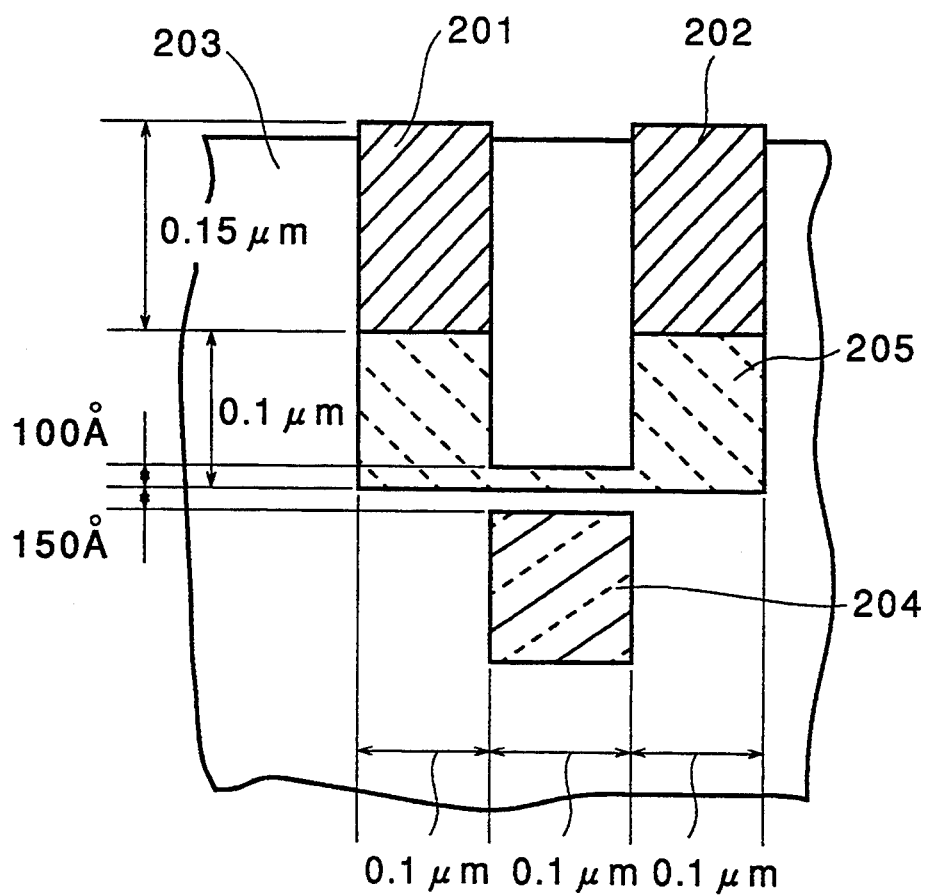
FIG. 23 is a fragmentarily sectioned view of a device model to be used for simulation of a transistor obtained by a method in the first embodiment of the invention.
Figure 24:
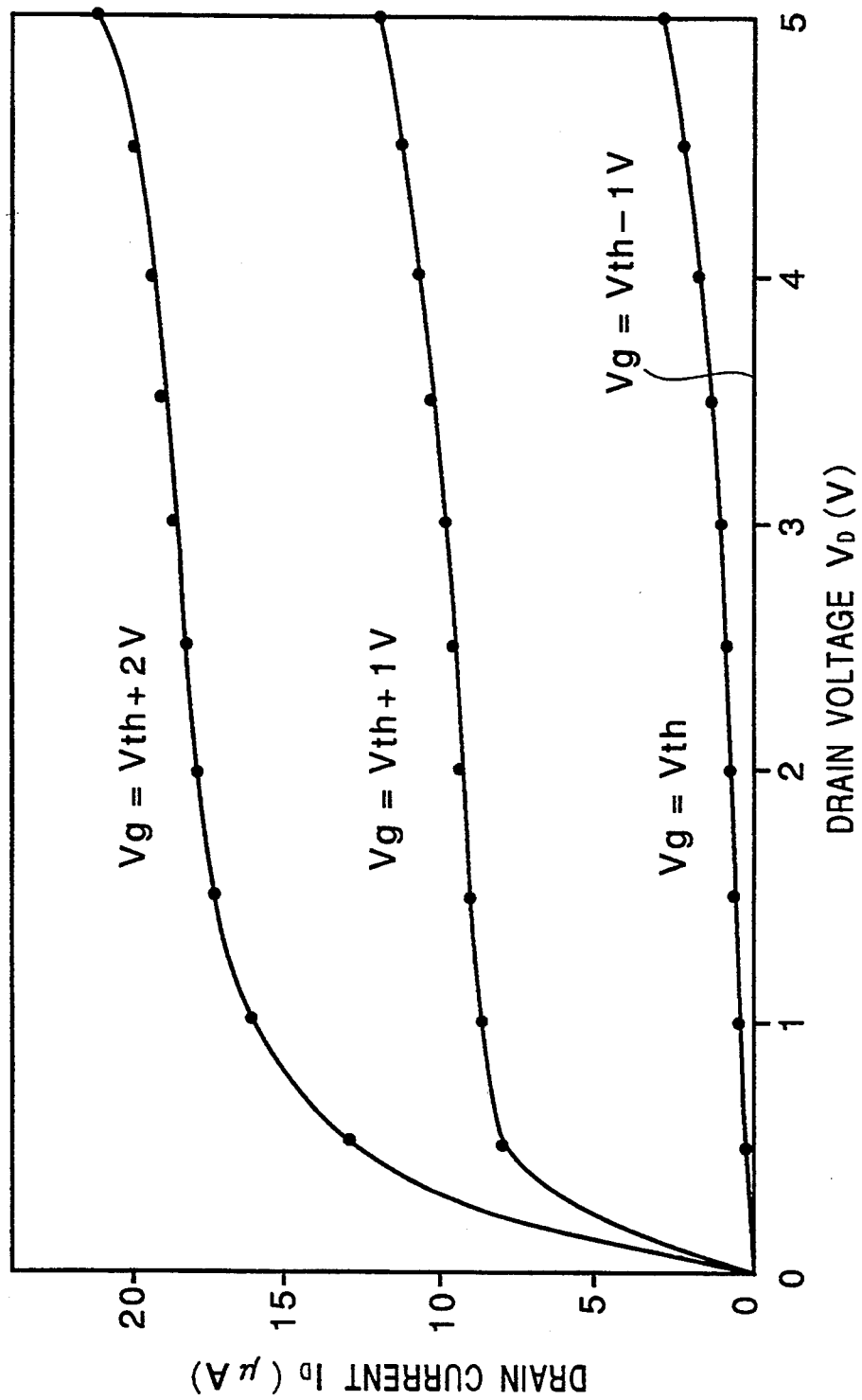
FIG. 24 is a characteristic curve diagram of $I_D$ relating to $V_D$ obtained by the simulation for the transistor of FIG. 23.
Figure 25:
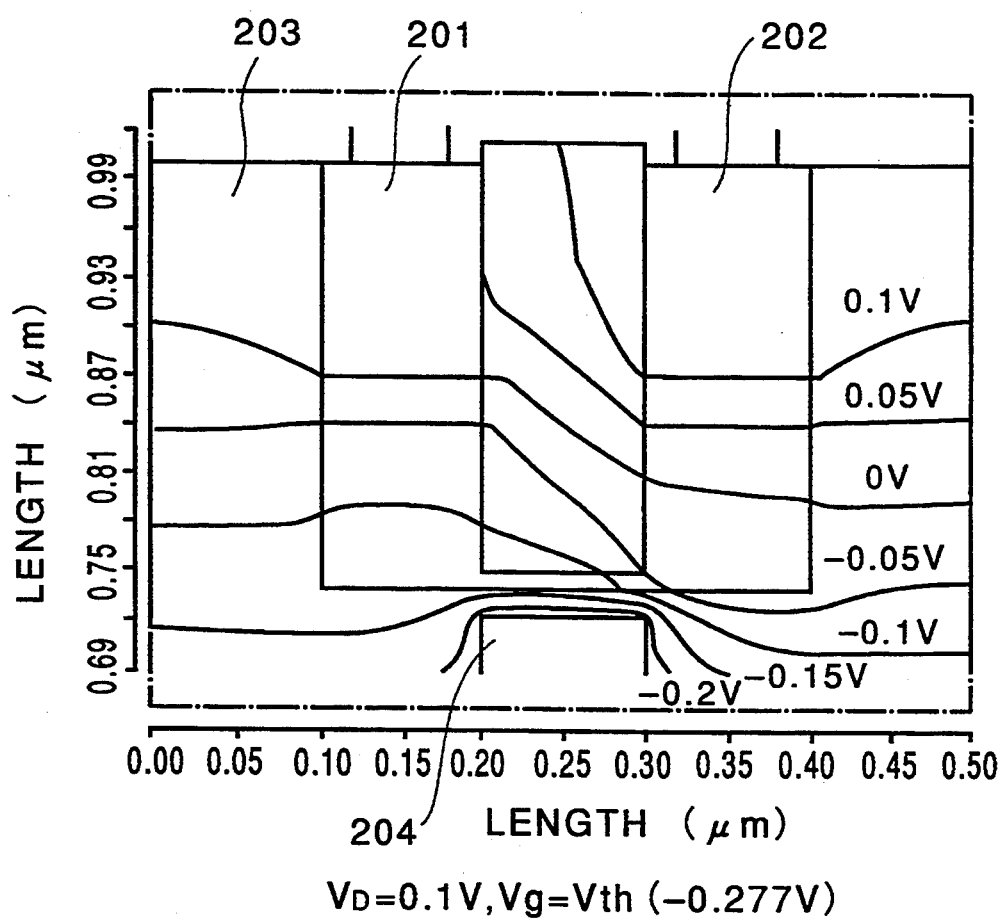
FIG. 25 is a potential distribution diagram obtained by the simulation when $V_D=0.1$ V and $V_g=V_{th}$ for the transistor of FIG. 23.
Figure 26:
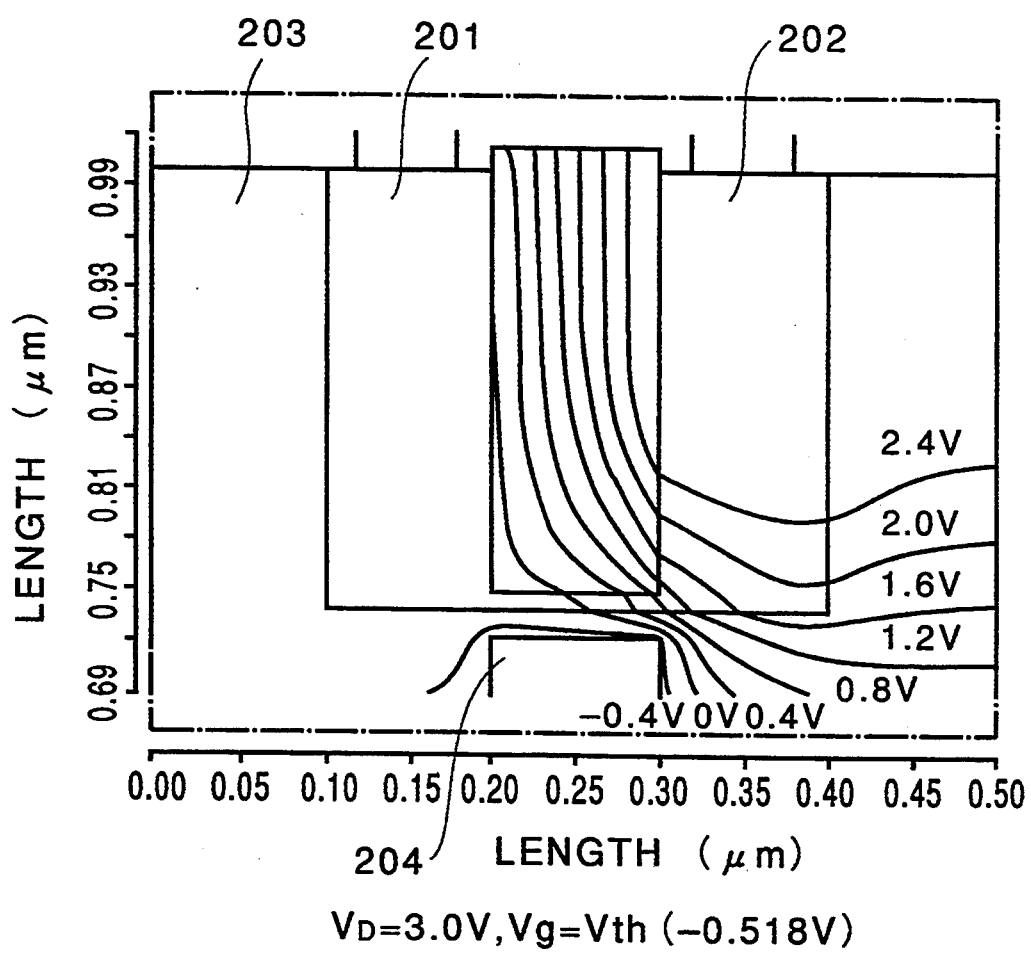

For the transistor in the first embodiment, the simulation result with the design standard of 0.1 micrometer is shown in FIGS. 23 to 26. FIG. 23 shows a size of the transistor and FIG. 24 shows a drain voltage dependency of the drain current. FIGS. 25 and 26 show a potential distribution at a drain voltage of 0.1 V and 3.0 V with use of the gate voltage as a threshold voltage.

In FIG. 23, numeral 201 depicts a source (ion-implantation of $As^+$ $5 \times 10^{20}$ cm$^{-3}$), 202 a drain (ion-implantation of $As^+$ $5 \times 10^{20}$ cm$^{-3}$), 203 a silicon dioxide film, 204 a gate (ion-implantation of $As^+$ $5 \times 10^{20}$ cm$^{-3}$), and 205 a low concentration region (ion-implantation of $P^+$ $1 \times 10^{17}$ cm$^{-3}$).

FIG. 24 exhibits a satisfactory characteristic without punchthrough and breakdown with an advantageous structure of the transistor for shortening the channel as the first embodiment.

Figure 1:
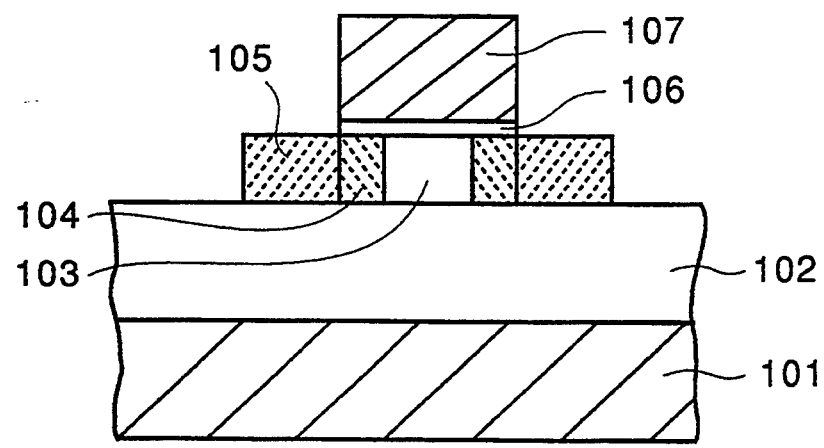
FIGS. 1 to 4 are fragmentarily sectioned views of the conventional SOIS devices.
Figure 2:
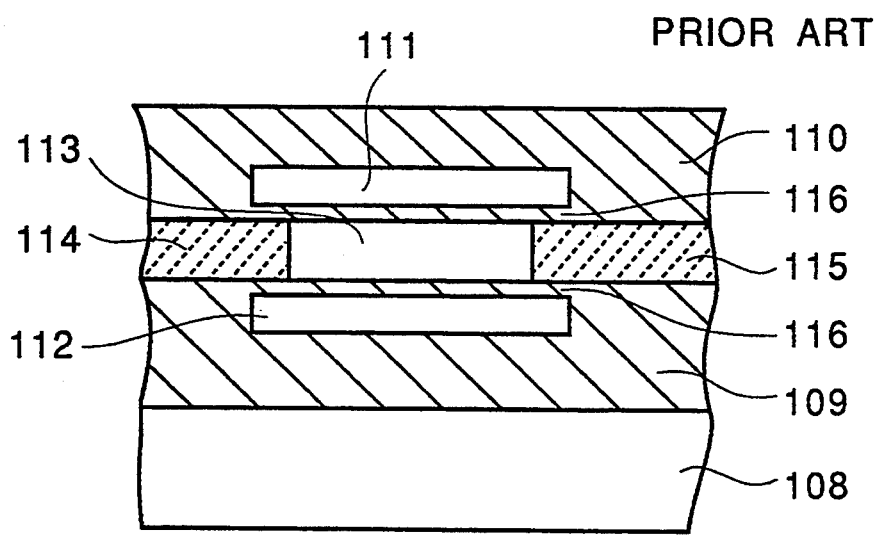
Figure 3:
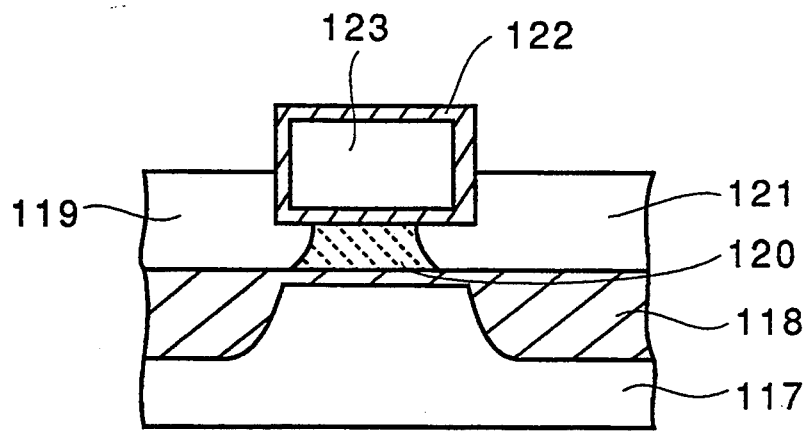
Figure 4:
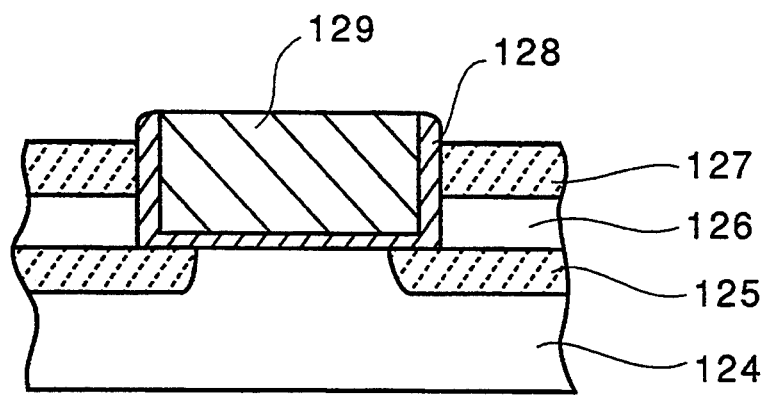

In FIGS. 25 and 26, the vertical section of the curve has an equivalent potential line to exhibit relaxation of an electric field. The equivalent potential line has an extended interval at the lower drain to show a smaller overlap capacity. Since the equivalent potential line has a slow curve at the lower drain, unlike the conventional example (FIG. 2), no problem arises relating to the electric field concentration at the lower corner of the gate electrode. Further, unlike the conventional example (FIG. 2), the gate electrode may be extended to the right and left with an innovated freedom of the arrangement thereof.

In the recitation of the first, second and third embodiments, the SOIS with the protrusions and the depression is supported. In the first embodiment, it employs an easier process of forming by the etching. In the second embodiment, the SOIS film thickness may satisfactorily be controlled since the film thickness of SOIS may be determined by the deposit film thickness of the spacer even at the vertical portion and the horizontal portion. In the third embodiment, the SOIS film thickness may be varied depending on the location by depositing a plurality of times the spacer material.

In the first embodiment, the SOIS film is grown on the gate electrode by a method of the first, second or third embodiment, and the transistor of the first embodiment may be formed.

A method of forming the transistor of the first embodiment is recited in the fourth and fifth embodiments. Thus the implementation of the transistor is simplified and facilitated in the fourth embodiment where the larger dimension of the design is provided. A method of the fifth embodiment facilitates control of the vertical impurity profile by doping at the vertical growth.

In the sixth embodiment, an effective method is proposed when steepness for the vertical impurity profile is not required although the doping at the vertical crystal growth may not be performed.

In the sixth embodiment, a method of producing the transistor of the first embodiment is proposed based on the sixth embodiment.

What is claimed is:

1. A method of producing a semiconductor on an insulating substrate (SOIS) with use of a lateral vapor phase epitaxial growth, comprising the steps of:

depositing a second material on an insulator made of a first material formed on a semiconductor substrate so as to contact a part of the second material with a semiconductor monocrystal area formed in the insulator, patterning the second material by etching to have protrusions and a depression vertical to a surface of insulator formed on the semiconductor substrate and for obtaining a longitudinally and uniformly extended section, coating the second material with a cover made of an insulation film, providing an opening apart from the semiconductor monocrystal area on a part of the cover, removing the second material from the opening by the selective etching of the second material to form a slit, and growing selectively epitaxially a semiconductor in the slit with use of the semiconductor monocrystal area as a seed whereby to produce a monocrystal semiconductor with a uniform section extended to a length.

2. A method of producing a semiconductor on an insulating substrate MOSFET (SOISMOSFET) comprising the steps of:

forming a control electrode on an insulating layer formed on a semiconductor substrate, forming a semiconductor on an insulating substrate (SOIS) film having upward protrusions embracing a channel region for positioning at least a part of the channel region on the control electrode after an insulating film is arranged on the control electrode surface, and forming a high concentration impurity layer.

3. The method of producing a SOISMOSFET as claimed in claim 2, wherein the step of forming the SOIS film comprises the steps of:

depositing a second material on an insulator made of a first material formed on a semiconductor substrate so as to contact a part of the second material with a semiconductor monocrystal formed in the insulator, patterning the second material by etching to have protrusions and a depression vertical to a surface of the insulator formed on the semiconductor substrate and for obtaining a longitudinally and uniformly extended section, coating the second material with a cover made of an insulating film, providing an opening apart from the semiconductor monocrystal on a part of the cover, removing the second material from the opening by the selective etching of the second material to form a slit, and growing selectively epitaxially the semiconductor in the slit with the use of the semiconductor monocrystal as a seed whereby to produce a monocrystal semiconductor with a uniform section extended to a length.

4. The method of producing a SOISMOSFET as claimed in claim 2, wherein the high concentration impurity layer is formed by one of an ion-implantation and a diffusion.

5. The method of producing a SOISMOSFET as claimed in claim 2, wherein the high concentration impurity layer is formed by an epitaxial growth.

6. The method of producing a SOISMOSFET as claimed in claim 2, further comprising the step of: introducing an impurity into a portion of the SOISMOSFET other than the high concentration layer.

7. The method of producing a SOISMOSFET as claimed in claim 6, wherein the impurity is introduced by one of ion-implantation and diffusion.

8. The method of producing a SOISMOSFET as claimed in claim 6, wherein the impurity is introduced by doping during the SOIS film growth.

* * * * *